(12) United States Patent
Matsuyama

(10) Patent No.: US 6,636,207 B2
(45) Date of Patent: Oct. 21, 2003

(54) DISPLAY DRIVER IC

(75) Inventor: Shigeru Matsuyama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 93 days.

(21) Appl. No.: 09/944,206

(22) Filed: Sep. 4, 2001

(65) Prior Publication Data

US 2002/0033810 A1 Mar. 21, 2002

(30) Foreign Application Priority Data

Sep. 5, 2000 (JP) .......................................... 2000-268277
Aug. 13, 2001 (JP) .......................................... 2001-245392

(51) Int. Cl.[7] ................................................. G09G 5/00
(52) U.S. Cl. ........................ 345/204; 345/208; 345/98; 345/99; 345/100
(58) Field of Search .............................. 345/87, 98–100, 345/204, 208; 711/167

(56) References Cited

U.S. PATENT DOCUMENTS

| | | | | |
|---|---|---|---|---|
| 5,530,457 A | * | 6/1996 | Helgeson | ..................... 345/531 |
| 5,592,423 A | * | 1/1997 | Tokami | ...................... 365/221 |
| 5,717,638 A | * | 2/1998 | Kim | ....................... 365/189.04 |
| 5,852,428 A | * | 12/1998 | Ishikawa et al. | ............. 345/100 |
| 6,078,544 A | * | 6/2000 | Park | ....................... 365/230.05 |
| 6,222,518 B1 | * | 4/2001 | Ikeda et al. | .................... 345/98 |
| 6,384,445 B1 | * | 5/2002 | Hidaka et al. | ............... 257/306 |
| 6,472,703 B1 | * | 10/2002 | Nakamura | .................. 257/304 |
| 6,480,947 B1 | * | 11/2002 | Hasegawa et al. | .......... 711/167 |

* cited by examiner

Primary Examiner—Amare Mengistu
Assistant Examiner—Leonid Shapiro
(74) Attorney, Agent, or Firm—Oliff & Berridge, PLC

(57) ABSTRACT

The invention provides a first pair of bit lines BM and $\overline{BM}$ that read data from a specified one of memory cells in a memory cell column, and a second pair of bit lines BS and $\overline{BS}$ that write data in another specified one of the memory cells in the memory cell column include a display read line that successively reads out display data from the memory cell column. As viewed in a plan view, the display read line is disposed between the pair of bit lines BS and $\overline{BS}$. Potentials of signals that are transmitted through the pair of bit lines BS and $\overline{BS}$ are in a mutually opposite relationship. Therefore, even when coupling capacitors are formed between the pair of bit lines BS and $\overline{BS}$ and the display read line, the charges that are charged and discharged between the capacitances and the display read line are offset, and therefore the signal potential on the display read line does not deteriorate.

6 Claims, 4 Drawing Sheets

DISPLAY DRIVER IC

BACKGROUND OF THE INVENTION

1. Field of Invention

The present invention relates to a display driver IC with a triple-port RAM built therein.

2. Description of Related Art

An IC having a built-in RAM as a display driver IC is known. Furthermore, a triple-port RAM is known as a RAM that is used in the IC with the built-in RAM.

In the triple port RAM, two ports are used to write in and read out data from, for example, an MPU external to the IC. In other words, it is capable of writing data in a certain memory cell through one port, and reading data from another memory cell through another port at the same time. Therefore, this type of RAM requires two word lines and two pairs of bit lines for one memory cell. Furthermore, the remaining one port among the three ports is connected to a line that is exclusively used for reading data from memory cells for display. For this reason, each of the memory cells is also connected to the display word line and the display read line.

In recent years, processes have been developed for manufacturing even more miniaturized semiconductor devices, and memory devices with greater memory capacity have been developed.

An IC with a built-in RAM having many memory cells is manufactured using the miniaturization process, and a liquid crystal display panel is driven by the IC with a built-in RAM.

In some instances, it has been confirmed that data in the RAM are not displayed as they are written. It has been determined that these incidents result from the fact that signals read out through the display read line are interfered with by other wirings and thus deteriorated.

SUMMARY OF THE INVENTION

It is an object of the present invention to provide a display driver IC that can drive display elements for display according to data written in memory cells.

It is another object of the present invention to provide a display driver IC that can prevent problems that may result from capacitor coupling between a display read line and two pairs of bit lines.

It is still another object of the present invention to provide a display driver IC that can prevent interference between a display read line and two pairs of bit lines.

A display driver IC in accordance with the present invention includes:

a plurality of memory cells arranged in a column direction;

a plurality of word lines arranged along a row direction, and capable of asynchronously selecting any two of the plurality of memory cells;

two pairs of bit lines extending along the column direction and commonly used by the plurality of memory cells, which are to be connected to selected two of the memory cells;

a plurality of display word lines that successively select the plurality of memory cell along the column direction; and a display read line extending along the column direction and commonly used by the plurality of memory cells, which is to be connected to one of the memory cells successively selected by the plurality of display word lines, such that, as viewed in a plan view, the display read line is disposed in one of the two pairs of bit lines.

DETAILED DESCRIPTION OF PREFERRED EMBODIMENTS

Figure 1:
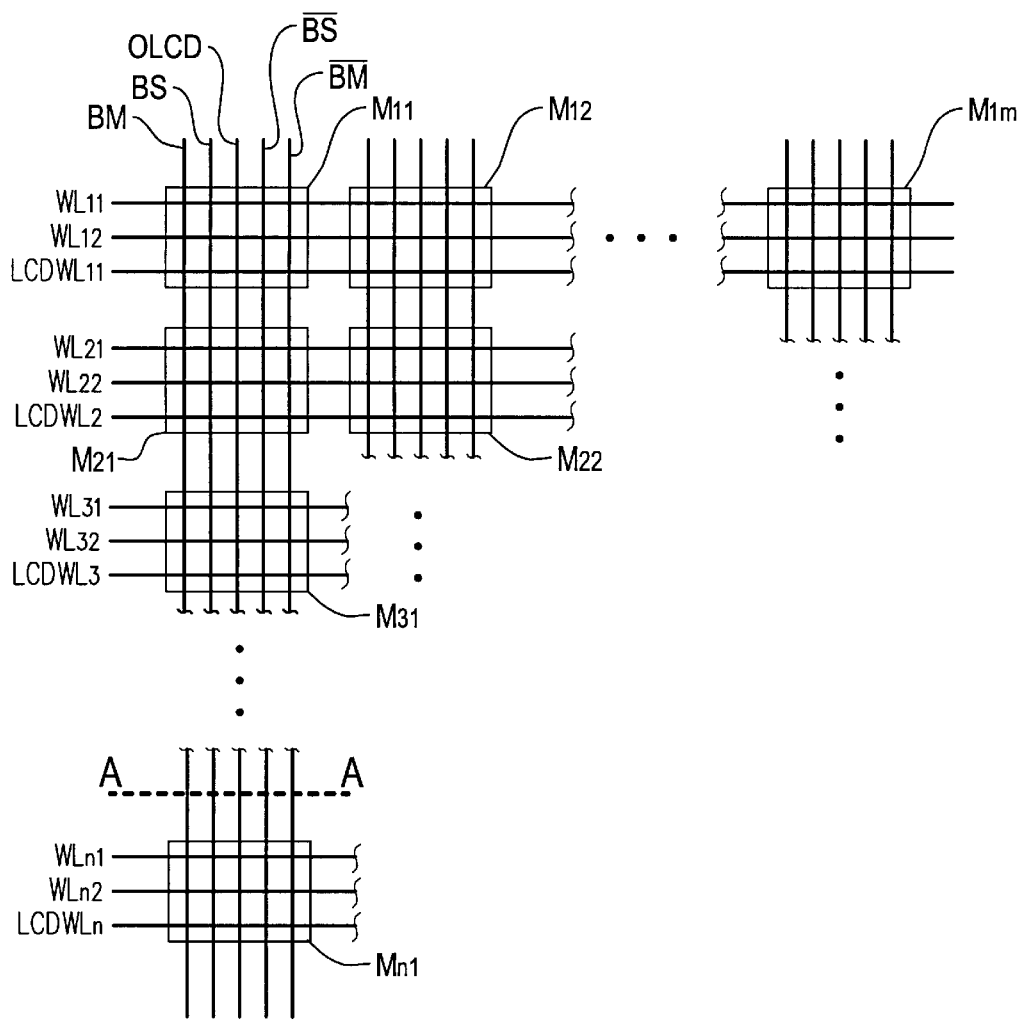
FIG. 1 schematically shows a plan view of a memory region of a display driver IC in which the present invention is applied.

A display driver IC in accordance with an embodiment of the present invention includes:

a plurality of memory cells arranged in a column direction;

a plurality of word lines arranged along a row direction, and capable of asynchronously selecting any two of the plurality of memory cells;

two pairs of bit lines extending along the column direction and commonly used by the plurality of memory cells, which are to be connected to selected two of the memory cells;

a plurality of display word lines that successively select the plurality of memory cell along the column direction; and a display read line extending along the column direction and commonly used by the plurality of memory cells, which is to be connected to one of the memory cells successively selected by the plurality of display word lines, such that, as viewed in a plan view, the display read line is disposed in one of the two pairs of bit lines.

In accordance with the embodiment of the present invention, signals that are transmitted through the pair of bit lines disposed on both sides of the display read line, as viewed in a plan view, have mutually opposite potentials. Signals that are transmitted through the pair of bit lines change mutually in synchronism, in which one of them changes from HIGH to LOW, the other changes from LOW to HIGH.

Accordingly, even when coupling capacitors are formed between the display read line and the pair of the respective bit lines, charges, that are charged or discharged between each of the capacitors and the display read line, are countervailed. Therefore, even when the potential on one pair of bit lines changes, the potential on the display read line does not change. Also, since potentials on the bit lines on both sides of the display read line are in an opposite relationship, the interference from one pair of bit lines are countervailed, and therefore would not provide deteriorating effects on the signal potential transmitted on the display read line.

Here, the pair of bit lines disposed on both sides of the display read line, as viewed in a plan view, may be formed in the same layer as the display read line, or may be formed in a layer different from the display read line with an interlayer dielectric film being interposed therebetween. In either of these cases, a transient deterioration of the display data potential due to the coupling capacitance can be prevented.

The embodiment of the present invention may preferably be implemented in a display driver IC which is manufactured using a deep sub-micron process for lines and space having a minimum width of 0.25 μm or less.

This is preferred because, in such a driver IC in which a display read line is disposed between bit lines whose potentials asynchronously change, potential of the display data transiently changes due to the capacitor coupling.

The embodiment of the present invention can be implemented in a memory having a large memory capacity, such as, for example, one with a total number of multiple memory cells arranged in the column direction that is 280 or greater, because, in this case, the coupling capacitor value described above becomes greater.

The embodiment of the present invention may be particularly preferable when the total number of 280 or greater multiple memory cells arranged in the column direction are formed using a miniaturization process of 0.25 μm or less. This is preferred because error data detection becomes more noticeable since the minimum width of lines and spaces is 0.4 μm or less, the inter-line space becomes narrower and the wiring capacitance itself increases. In this way, the embodiment of the present invention may be preferable when memory cells having the minimum width of lines and spaces of 0.4 μm or less are formed. Here, lines and space refer to a pitch between adjacent wiring patterns formed in an identical layer.

Embodiments of the present invention are described with reference to the accompanying drawings. FIG. 1 schematically shows a RAM region included in a display driver IC. Display driver ICs in which the present invention is applied may include, besides the RAM shown in FIG. 1, an interface for an external MPU, an MPU system control circuit that controls a RAM according to instructions from the MPU, an LCD system control circuit that controls a RAM for a display, such as a liquid crystal display, a driver section that converts data read out from a RAM to a voltage to drive display elements, such as liquid crystal elements and the like.

(Description of Memory Cell)

Referring to FIG. 1, the display driver IC has a 3-port RAM having a total of (m×n) memory cells M11~Mmn disposed in a matrix of m memory cells in a row direction and n memory cells in a column direction.

Figure 2:
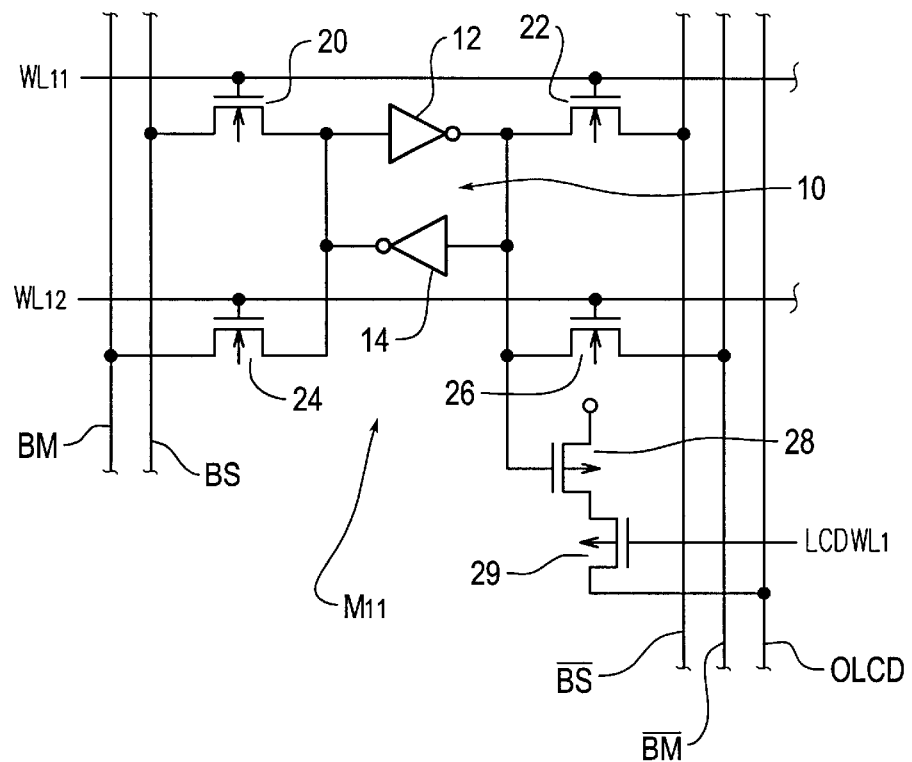
FIG. 2 schematically shows an enlarged explanatory illustration of one of memory cell groups.

Each of the memory cells M11~Mmn has the same structure, and one of them, the memory cell M11, is shown in FIG. 2.

Referring to FIG. 2, the memory cell M11 has a flip-flop 10 that is formed of two inverters 12 and 14 connected in a loop configuration. The flip-flop 10 is connected to a pair of bit lines BM and $\overline{BM}$, and a pair of bit lines BS and $\overline{BS}$ through first-fourth transistors 20, 22, 24 and 26 that are formed from, for example, N-type MOS transistors that are driven by first and second word lines WL11 and WL12. The pair of bit lines BM and $\overline{BM}$ transfer signals having mutually opposite logics. When a potential on the bit line BM is HIGH, a potential on the bit line $\overline{BM}$ is LOW. This relationship similarly applies to the pair of bit lines BS and $\overline{BS}$.

Here, the first and second word lines WL11 and WL12 are commonly used by the memory cells M11, M12, . . . M1m in the first row. As shown in FIG. 1, the first and second word lines WL21, WL22, . . . , WLn1, WLn2 that are commonly used by other memory cell groups are provided.

By selecting one of the first word lines WL11, WL21, . . . WLn1, memory cells in a specified row can be selected. By selecting one of the second word lines WL12, WL22, . . . WLn2 asynchronously with the aforementioned selection operation, memory cells in another row can be selected.

Also, referring to FIG. 2, when the first word line WL11 is selected, the first and second transistors 20 and 22 turn on, with the result that the flip-flop 10 is connected to the pair of bit lines BS and $\overline{BS}$. Accordingly, data from an MPU can be written in the memory cell M11 through the pair of bit lines BS and $\overline{BS}$.

In the 3-port RAM shown in FIG. 1, during the period when the memory cell M11 is being selected, another memory cell, belonging to the same column that includes the memory cell M11, can be selected.

For example, when the second word line WL21 is selected in the second row, the flip-flop 10 in the memory cell M21 is connected to the pair of bit lines BM and $\overline{BM}$. Accordingly, data can be read out from the memory cell M21 through the pair of bit lines BM and $\overline{BM}$ and output to MPU.

Here, the pair of bit lines BM and $\overline{BM}$ can be exclusively used to read data, and the pair of bit lines BS and $\overline{BS}$ can be exclusively used to write data, or they may be used vice versa. However, without being limited to this example, both of the pair of bit lines BM and $\overline{BM}$ and the pair of bit lines BS and $\overline{BS}$ can be used for both of data wiring and data reading.

The triple port RAM is further provided with a plurality of display word lines LCDWL1~LCDWLn that successively select the memory cells in each column along the column direction. Also, a display read line OLCD is provided that extends in the column direction and commonly used by the memory cells M11~M1n in one column, and that is connected to one of the memory cells successively selected by the display word lines LCDWL1~LCDWLn.

Assuming that, before data is read out through the display read line OLCD, the display read line OLCD is pre-charged to a specified potential. In the present embodiment, it is pre-charged to LOW.

In order to supply data at HIGH corresponding to a potential retained at the flip-flop 10 to the display read line OLCD that is pre-charged to LOW, transistors 28 and 29 that are formed from, for example, P-type MOS transistors are provided. The transistors 28 and 29 are serially connected between a supply line that supplies the power supply potential VDD and the display read line OLCD.

The transistor 28 has its gate connected to an output line of the inverter 12, and the transistor 29 has its gate connected to the display word line LCDWL1.

Accordingly, when the potential on the display word line LCDWL1 becomes LOW and the memory cell M11 is thus selected for display, the transistor 29 turns on. At this moment, when an output of the inverter 12 is LOW, the transistor 28 also turns on. As a result, the display read line OLCD that is pre-charged to LOW is charged to the VDD potential, such that HIGH is read out. Conversely, when an output from the inverter 12 is HIGH, the transistor 28 turns off, such that the potential on the display read line OLCD that is pre-charged to LOW does not change, and LOW is read out.

By performing such reading operations for display by successively selecting the memory cells along the column direction, reading data that drives a liquid crystal display panel, for example, can be conducted.

(Cross-Sectional Structure)

Figure 3:
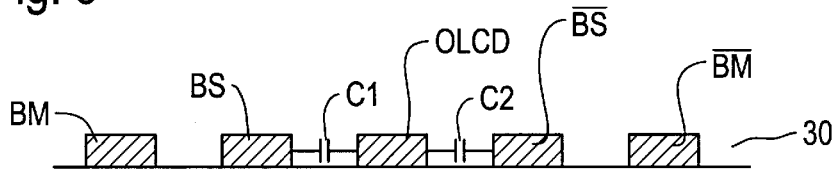
FIG. 3 is a partial cross-sectional view taken along plane A—A of FIG. 1.

FIG. 3 is a partial cross section taken along plane A—A of FIG. 1, and shows positions where the pair of bit lines BM and $\overline{BM}$, the pair of bit lines, and the display read line OLCD are formed.

In the structure shown in FIG. 3, the two pairs of bit lines BM and $\overline{BM}$, BS and $\overline{BS}$ and the display read line OLCD are all formed in the same layer, for example, in a metal second layer 30.

Furthermore, as viewed in a plan view, the display read line OLCD is disposed between one of the two pairs of bit lines, for example, the pair of bit lines BS and $\overline{BS}$.

(Cross-Sectional Structure of Comparison Example)

Figure 4:
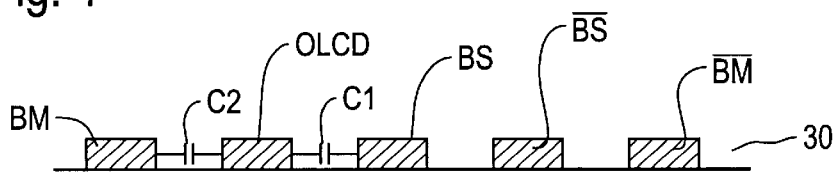
FIG. 4 is a partial cross-sectional view of a comparison example to be compared to FIG. 3.
Figure 5:
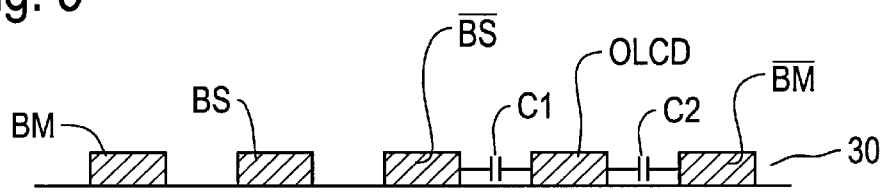
FIG. 5 is a partial cross-sectional view of another comparison example to be compared to FIG. 3.

FIGS. 4 and 5 show cross-sectional views in part of comparison examples, respectively. In FIG. 4, a display read line OLCD is disposed between bit lines BM and BS. In FIG. 5, a display read line OLCD is disposed between bit lines $\overline{BM}$ and $\overline{BS}$.

(Description of Operation of Comparison Example)

The same operation example is examined for a 3-port RAM having the structure shown in FIG. 4 or FIG. 5. In other words, the examination is done for operations in which data writing or data reading is performed between specified memory cells in the same column and the MPU, while data for display is successively read from the multiple memory cells M11, M12, ... M1n in the first column shown in FIG. 1.

With the structure shown in FIG. 4, if the potential on the bit line BM or BS changes while reading data for display is performed, a problem occurs. For example, as shown in FIG. 6, a situation is considered in which, while the potential on the bit line BM is maintained at HIGH, the potential on the bit line BS changes from HIGH to LOW.

Figure 6:
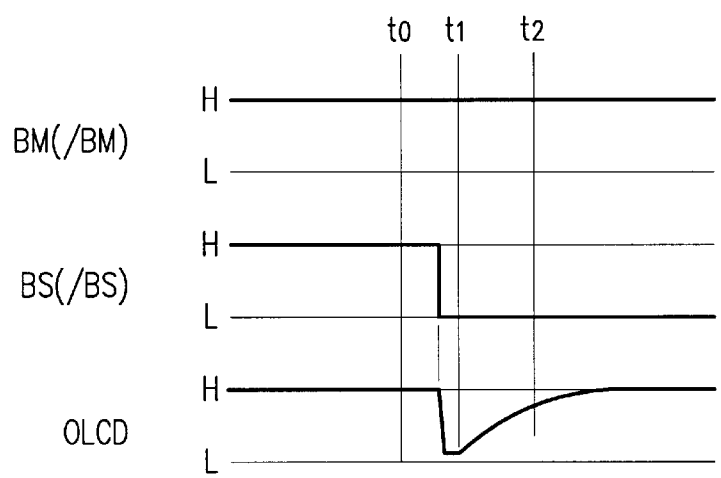
FIG. 6 is a waveform diagram to describe malfunctions of the comparison example having the structure shown in FIG. 4 or FIG. 5.

Referring to FIG. 6, when the potential on the bit line BS changes from HIGH to LOW, the potential on the display read line OLCD temporarily drops from HIGH, and thereafter gradually returns to HIGH.

The transient change of the potential on the display read line OLCD is assumed to be resulted from the fact that, for example, the bit line BS and the display read line OLCD that are formed at an interval of 0.25 μm are mutually capacitively coupled by a coupling capacitor C1.

Initially, at time t0 shown in FIG. 6, a charge in the coupling capacitor C1, that is formed between the bit line BS, and the display read line OLCD is stable. At time t1, the potential on the bit line BS is switched from HIGH to LOW, and at this moment, a positive charge flows from the display read line OLCD to the coupling capacitor C1. As a result, at time t1 shown in FIG. 6, the potential on the display read line OLCD transiently drops. During the period in which a charged is charged in the coupling capacitance C1, the amount of charge flowing from the display read line OLCD to the coupling capacitance C1 reduces, and therefore the potential on the display read line OLCD gradually revives at time t2 shown in FIG. 6.

Here, when the reading frequency becomes high due to an increased number of display pixels, the latch timing of the display read line OLCD becomes shorter. In this instance, if the data latch period is set at a timing that includes time t1 shown in FIG. 6, data that is originally HIGH may be erroneously recognized as LOW.

Such a phenomenon likewise occurs between the bit line BM and the display read line OLCD, and display data may be erroneously recognized due to the presence of a coupling capacitor C2 shown in FIG. 4.

Similarly, the structure example shown in FIG. 5 has the same problem as that of the structure example shown in FIG. 4, due to the presence of a coupling capacitance C1 between the bit line $\overline{BS}$ and the display read line OLCD, or a coupling capacitance C2 between the bit line $\overline{BM}$ and the display read line OLCD.

Furthermore, if any one of the bit lines whose potential changes is disposed close to the display read line OLCD, the potential on the display read line may be deteriorated by the interference from the bit line whose potential changes.

(Description of Operatin of Embodiment)

It has been confirmed that, when the cross-sectional structure of the comparison example shown in FIG. 4 or FIG. 5 is enhanced to the cross-sectional structure shown in FIG. 3, deterioration of data potential associated with the above-described capacitor coupling or the interference can be prevented without increasing the area occupied by the memory cells.

In accordance with the structure shown in FIG. 3, the display read line OLCD is disposed between the pair of bit lines BS and $\overline{BS}$. Potentials of signals that are transmitted on the pair of bit lines BS and $\overline{BS}$ are in an inverse relationship. In other words, signals that are transmitted through the pair of bit lines BS and $\overline{BS}$ change mutually in synchronism, in which one of them changes from HIGH to LOW, the other changes from LOW to HIGH.

Figure 8:
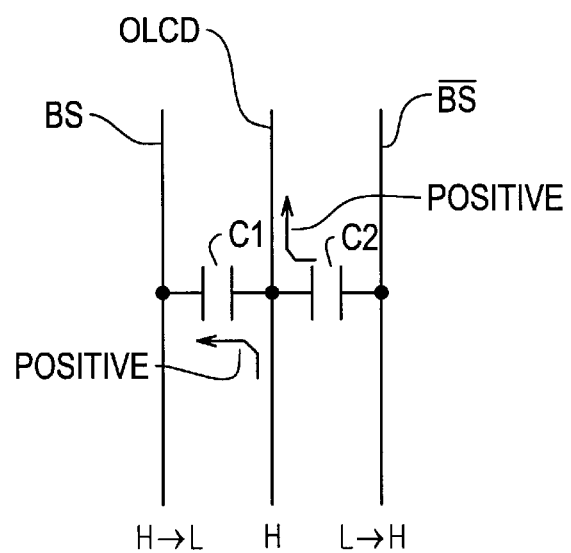
FIG. 8 is a circuit diagram to describe an operation of the present embodiment having the structure shown in FIG. 3.

The display read line OLCD has a coupling capacitor C1 between itself and the bit line BS, and a coupling capacitor C2 between itself and the bit line $\overline{BS}$, as shown in FIG. 8.

Figure 7:
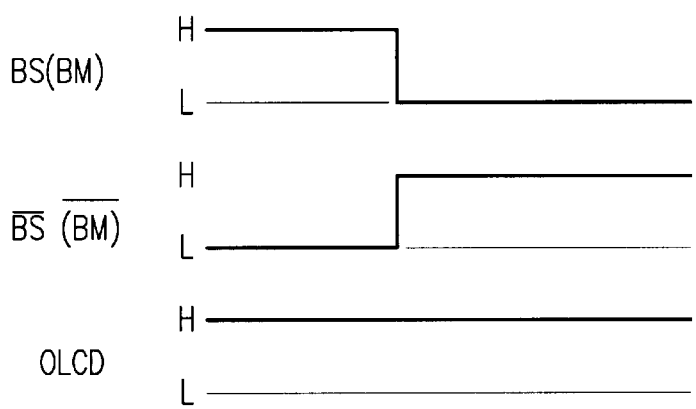
FIG. 7 is a waveform diagram to describe an operation of the present embodiment having the structure shown in FIG. 3.

Here, as shown in FIG. 7, potentials on the bit lines BS and $\overline{BS}$ change mutually in synchronism between opposite potentials. In this instance, as shown in FIG. 8, a positive charge flows in the coupling capacitor C1 from the display read line OLCD, and a positive charge simultaneously flows in the display read line OLCD from the coupling capacitor C2. As a result, the charges that are charged in and discharged from the display read line OLCD are offset, and therefore the potential on the display read line OLCD does not change.

Furthermore, since potentials on the pair of bit lines BS and $\overline{BS}$ on both sides of the display read line OLCD are mutually opposite, interference from the pair of bit lines BS and $\overline{BS}$ are offset and do not provide deteriorating influence on the signal potential that is transmitted through the display read line OLCD.

The capacitance value of the coupling capacitors C1 and C2 becomes greater as the length of the two pairs of bit lines BM and $\overline{BM}$, and BS and $\overline{BS}$ becomes longer, and the length becomes greater as the memory capacity of the RAM becomes greater. Also, the capacitance value becomes greater as the gap between the bit lines becomes narrower, and the gap becomes narrower as the semiconductor process is further miniaturized.

The inventors of the present invention confirmed the above-described deterioration of display data when the minimum width of lines and spaces provided by the semiconductor process is 0.25 μm or less, and the number of memory cells in the column direction shown in FIG. 1 exceeds 280.

(Description of Other Structures)

Figure 9:
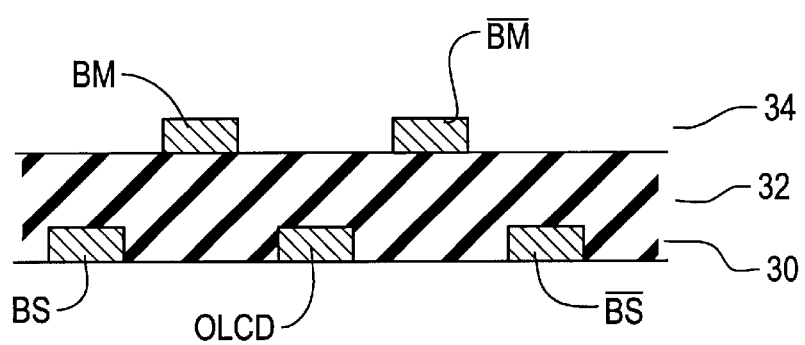
FIG. 9 is a partial cross-sectional view of another cross-sectional structure different from the one shown in FIG. 3.

Referring to FIG. 9, a pair of bit lines BS and $\overline{BS}$ and a display read line OLCD are disposed in a metal second layer 30, and a pair of bit lines BM and $\overline{BM}$ are disposed in a metal third layer 34 through an interlayer dielectric film 32.

As a result, the space between the pair of bit lines BS and $\overline{BS}$ shown in FIG. 9 is wider compared to the structure example shown in FIG. 3. By widening the distance between the bit line BS and the display read line OLCD, and the distance between the bit line $\overline{BS}$ and the display read line OLCD, the coupling capacitors C1 and C2 shown in FIG. 8 become almost negligible.

In the structure example shown in FIG. 9, as viewed in a plan view, the display read line OLCD is disposed between the pair of bit lines BM and $\overline{BM}$ that are formed in a layer different from the layer in which the display read line OLCD is formed. Therefore, although depending on the thickness of the interlayer dielectric film 32, the display read line OLCD is disposed closer to the pair of bit lines BM and $\overline{BM}$ rather than to the pair of bit lines BS and $\overline{BS}$.

However, even when the coupling capacitors C1 and C2 are formed between the display read line OLCD and the pair of bit lines BM and $\overline{BM}$, changes in the potential on the display read line OLCD can be prevented in a manner described above.

Furthermore, the display read line OLCD and the pair of bit lines BM and $\overline{BM}$ are isolated from one another by the interlayer dielectric film 32 being interposed therebetween. Moreover, the lines OLCD, BM and $\overline{BM}$ are formed through the interlayer dielectric film 32 in positions that are not opposite to one another. As a result, capacitive coupling itself is prevented from forming between the display read line OLCD and the pair of bit lines BM and $\overline{BM}$.

It is noted that the pair of bit lines BM and $\overline{BM}$ may be formed in the same layer as the display read line OLCD, and the pair of bit lines BS and $\overline{BS}$ may be formed in a layer different from the display read line OLCD, unlike the one shown in FIG. 9. Also, unlike the one shown in FIG. 9, the display read line OLCD and the pair of bit lines BS and $\overline{BS}$ may be disposed in an upper layer, and the pair of bit lines BM and $\overline{BM}$ may be disposed in a lower layer.

The present invention is not limited to the embodiments described above, but many modifications can be made within the scope of the subject matter of the present invention. The present invention is applicable to a display driver IC with a triple port RAM including two pairs of bit lines and a display read line, and is not necessarily limited to a liquid crystal display panel as an object to be driven.

What is claimed is:

1. A display driver IC, comprising:
   a plurality of memory cells arranged in a column direction;
   a plurality of word lines arranged along a row direction, and capable of asynchronously selecting any two memory cells of the plurality of memory cells;
   two pairs of bit lines extending along the column direction and commonly used by the plurality of memory cells, the two pairs of bit lines being connected to selected two memory cells of the plurality of memory cells;
   a plurality of display word lines that successively select the plurality of memory cell along the column direction; and
   a display read line extending along the column direction and commonly used by the plurality of memory cells, the display read line being connected to one memory cell of the plurality of memory cells successively selected by the plurality of display word lines, such that, as viewed in a plan view, the display read line is disposed in one pair of bit lines of the two pairs of bit lines.

2. The display driver IC according to claim 1, the pair of bit lines disposed on both sides of the display read line in a plan view being formed in the same layer as the display read line.

3. The display driver IC according to claim 1, the pair of bit lines disposed on both sides of the display read line in a plan view being formed in a layer different from the display read line with an interlayer dielectric film being interposed therebetween.

4. The display driver IC according to claim 1, wherein the display driver IC is manufactured using a deep sub-micron process for lines and space having a minimum width of 0.25 $\mu$m or less.

5. The display driver IC according to claim 1, the number of the plurality of memory cells arranged in the column direction being 280 or greater.

6. The display driver IC according to claim 1, the minimum width of lines and spaces being 0.4 $\mu$m or less.

* * * * *